United States Patent [19]
> Feltner

[11] 4,087,902
[45] May 9, 1978

[54] FIELD EFFECT TRANSISTOR AND METHOD OF CONSTRUCTION THEREOF

[75] Inventor: William R. Feltner, Huntsville, Ala.

[73] Assignee: The United States of America as represented by the Administrator of the National Aeronautics and Space Administration, Washington, D.C.

[21] Appl. No.: 699,012

[22] Filed: Jun. 23, 1976

[51] Int. Cl.² ............................................. B01J 17/34
[52] U.S. Cl. ...................................... 29/571; 29/578; 357/91
[58] Field of Search ..................... 29/571, 578; 357/91

[56] References Cited

U.S. PATENT DOCUMENTS

| | | | |
|---|---|---|---|
| 3,481,030 | 12/1969 | TeVelde | 29/571 |
| 3,679,492 | 7/1972 | Fang | 29/571 |
| 3,752,711 | 8/1973 | Kooi | 29/571 |
| 4,033,026 | 7/1977 | Pashley | 29/571 |

Primary Examiner—W. Tupman
Attorney, Agent, or Firm—George J. Porter; John R. Manning; L. D. Wofford, Jr.

[57] ABSTRACT

A field effect transistor and method of making the same wherein a semi-conductor layer is placed on an insulating substrate, and wherein the gate region is separated from source and drain regions of a like conductivity type to that of the source and drain regions but of reduced conductivity, the gate electrode and gate region of the layer being of generally reduced length, and the gate region being of greatest length on its surface closest to the gate electrode. This is accomplished by initially creating a relatively large gate region of one polarity, and then reversing the polarity of a central portion of this gate region by ion bombardment, thus achieving a narrower final gate region of the stated configuration.

3 Claims, 8 Drawing Figures

FIELD EFFECT TRANSISTOR AND METHOD OF CONSTRUCTION THEREOF

ORIGIN OF THE INVENTION

The invention described herein was made by an employee of the U.S. Government, and may be manufactured and used by or for the Government of the United States of America for governmental purposes without the payment of any royalties thereon or therefor.

BACKGROUND OF THE INVENTION

1. Field of the Invention

This invention relates to transistors, and particularly to field effect silicon-on-insulator transistors.

2. General Description of the Prior Art

Field effect transistors may be constructed of insulating substrates, and their use could be extended by modifications which would increase their switching speeds, while at the same time preserving their present low power requirements, that is, achieving a lower speed-power product than is currently obtainable. One factor limiting such improvement is that of channel length and the distance across the gate region of a transistor between the source and drain. Any reduction in this spacing in a conventional transistor of this type on an insulating substrate would result in a source-drain short at the semi-conductor substrate interface where this channel length is shortest due to the physical properties of this interface. Such a short would prevent other proper operation of the device, and, of course, must be avoided.

A second problem is that of gate-channel capacitance which must be minimized if frequency response is to be extended. To insure proper operation of such a transistor, the gate electrode must just overlap the source and drain regions slightly. Presently, the minimum overlap (which ideally should be made shorter) is limited by tolerances required by present-day techniques of wafer-mask alignment. This tolerance must be such as to insure that a control channel is formed by the gate electrode over the entire distance between the source and drain regions of the device. Otherwise, part of the gate region would not be under gate control, and a permanent diode would result, preventing operation of the device.

In order to reduce gate-channel capacitance, a field effect transistor has been developed in which a polycrystalline silicon P+ gate electrode is positioned over a conventional P type gate region, the latter separating the N+ source and drain regions. It has the advantage of virtually no gate overlap over source or drain, as the silicon gate is used to define N+ diffusion regions into the wafer making up the source and drain. Although this self-alignment technique does away with gate overlap capacitance, it does nothing to decrease channel length, i.e., source to drain spacing, one of the limitations referred to above.

Another means of reducing gate overlap capacitance is incorporated in another form of field effect transistor by means of an ion implantation technique as follows. N+ source and drain regions and a P type gate region are defined in a normal manner at a convenient spacing. Next, a gate electrode is made as small as possible, centered over the gate P region, and it defines an area smaller than the gate region, being limited by the ability to define a metal electrode. Next, the entire device is bombarded with N ions, causing source and drain N+ regions to extend into sides of the originally doped P region to thus effectively extend the source and drain gate regions up to a sharp line by the shadow of the gate electrode. This thus quite effectively prevents a gate electrode overlap over the source and drain regions and does away with the gate overlap capacitance. One disadvantage of this geometry is that because of the sharp doping profile achieved by the described technique, there may result a low voltage breakdown of the device due to high electric field intensities between the gate and source and drain regions.

Still another device, referred to as a double diffused metal oxide semi-conductor device, has been proposed as an improved higher speed field effect transistor. It, too, uses an auxiliary gate region, but differs from the self-alignment device described above in that the centrally positioned gate region is doped N rather than P, except for a very narrow region adjacent to the drain diffusion, which is doped P. It would seem that this geometry could provide a higher speed device. However, it also appears that there may be a significant signal propagation delay across the source to drain channel as a result of gate influence on the entire channel area, making the entire channel area a surface effect area. This, of course, could reduce or significantly limit any increase in switching speeds.

SUMMARY OF THE INVENTION

In accordance with the present invention, there is provided a field effect transistor which both reduces channel length between source and drain and reduces gate-channel capacitance. This is accomplished by the construction of a field effect transistor in which the central semi-conductor region is of the same polarity as the source and drain, but of reduced conductivity, and the gate region is formed by converting to an opposite polarity a narrow center region of the central region of the device. This construction reduces the effective channel length, and the channel length is made shortest near the gate electrode.

DETAILED DESCRIPTION OF THE DRAWINGS

This invention will be described in terms of a field effect silicon-on-insulator type construction.

Figure 1:
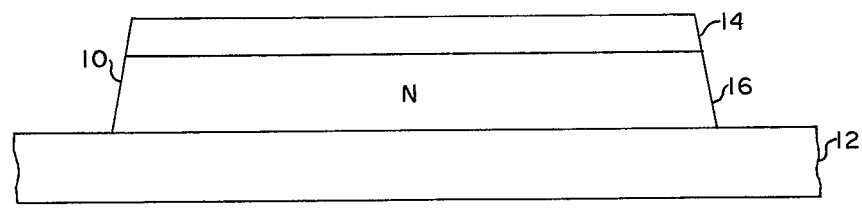
FIGS. 1–8 illustrate the fabrication steps in the manufacture of the transfer of this invention.

Referring to FIG. 1, silicon islands 10 are formed from a silicon layer which has been deposited on an insulating substrate 12 (e.g., $Al_2O_3$), one island for each transistor to be fabricated. Typically with logic circuitry there would be hundreds, or perhaps thousands, of discrete such islands for as many transistors. In one embodiment of the invention, the silicon material of a thickness of 1 micrometer is originally doped to an N state, then a first layer 14 of silicon dioxide, $SiO_2$ (an insulating layer) is grown to a thickness of 150 to 250 nanometers, leaving an N doped region 16 of a thickness of 890 to 930 nanometers.

Figure 2:
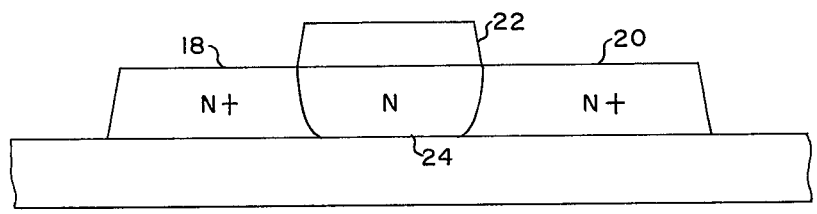
Figure 3:
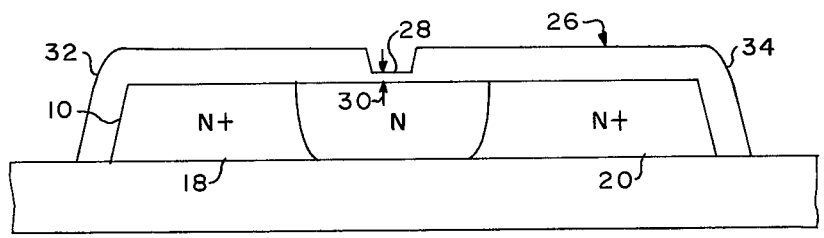

FIG. 2 illustrates the next step in which the $SiO_2$ layer 14 of FIG. 1 is selectively etched away to uncover spaced regions 18 and 20, leaving an $SiO_2$ diffusion mask 22. A material such as phosphorous is diffused into the exposed regions 18 and 20 to enhance the N semi-conductivity to achieve an increased conductivity compared to that of central region 24, which is masked from the diffusion process by the upper $SiO_2$ layer left on it as regions 18 and 20 are thus formed as source and drain regions, respectively. These regions are designated N+ regions, meaning that they have a higher concentration of carriers than regions simply designated as N or P.

Next, $SiO_2$ diffusion mask 22, shown in FIG. 2, is removed, and an $SiO_2$ layer 26 is grown over the outer top surface of the silicon layer, this $SiO_2$ layer being of a thickness of 800 to 1,000 nanometers. Gate implantation window 18, generally of a length of one micrometer or less (across the page), as limited by masking techniques, is then defined by removing the $SiO_2$ in this area directly over a central portion 30 of central region 24 of island 12. A thin $SiO_2$ layer of a thickness of 30 to 40 nanometers is then formed in window 28 to protect the silicon surface during ion bombardment.

Figure 4:
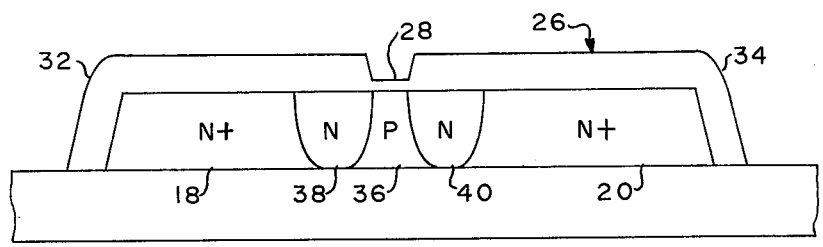

Next, referring to FIG. 4, island 10 is subject to a P type ion bombardment, with the result that thick regions 32 and 34 of $SiO_2$ layer 26 generally stop the ions, while a region 28 transmits them as in the case of normal ion implantation. As a result, there is created a P region 36 in island 10 between residual N regions 38 and 40. Dosage is selected such that the P type impurity concentration exceeds the N type concentration in regions 38 and 40, and is such that P region 36 concentration yields the desired threshold voltage for the device. P region 36 is thus formed as a quite short gate region.

Figure 5:
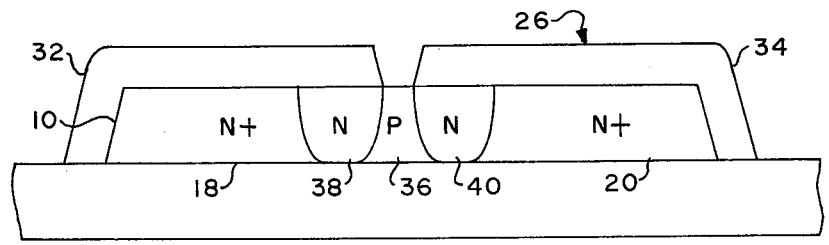

Next, referring to FIG. 5, the thin $SiO_2$ layer region 28 is etched away, and the wafer is cleaned preliminary to the application of a new $SiO_2$ surface layer.

Figure 6:
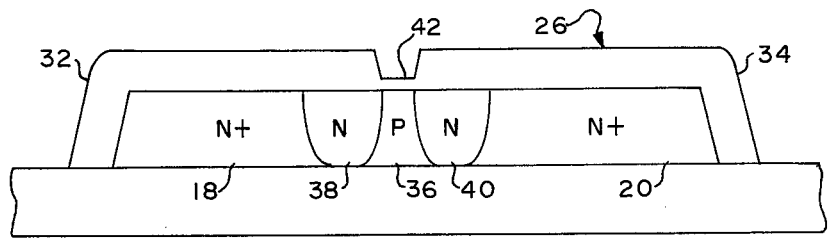

Referring to FIG. 6, a 100 to 110 nanometers $SiO_2$ gate layer 42 is grown over gate region 36.

Figure 7:
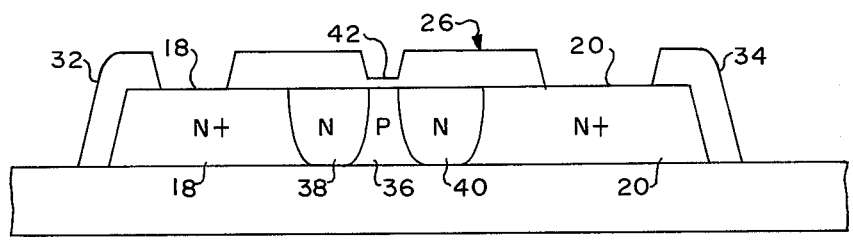

Next, as illustrated in FIG. 7, island 10 is masked, and portions of $SiO_2$ layers 32 and 34 over source and drain regions 18 and 20 are etched away.

Figure 8:
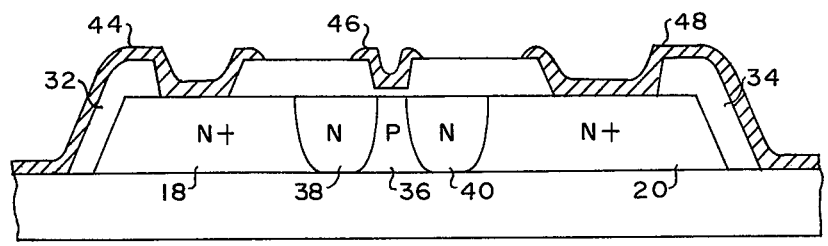

FIG. 8 illustrates the application of metal electrodes, these being affixed as drain electrode 44, gate electrode 46, and source electrode 48. These electrodes are applied in a conventional manner.

Electrically, the completed device has the same schematic symbol as a standard insulated gate field effect transistor and would be utilized in the same way, having particular application in logic switching and memory circuits. The method of construction outlined enables the production of a pseudo-self-aligned gate structure of very small gate dimensions. While the illustrated embodiment of the invention employs N type semi-conductive regions for the source and drain regions and a P type semi-conductive region for the gate region, it is to be appreciated that this arrangement may be reversed. Thus, complementary (P channel) devices may be constructed, which are particularly useful in complementary-pair switches. It is to be further noted that although silicon is discussed as the semi-conductive island material employed in the fabrication of the device of this invention, other semi-conductor materials may be employed. One such material would be gallium arsenide.

The device of this invention has two principal advantages over a conventional diffused source-drain and enhancement mode metal gate transistor which it is adapted to replace. First, the channel length across gate region 36 is made of minimum length just opposite the gate electrode where its control effect is maximum instead of at the opposite surface. This enables a shorter channel length with reductions in length of five or more times being possible. This reduction in turn enables a corresponding increase in transconductance ($g_m$) (or sensitivity or gain). Second, the gate-channel capacitance, particularly the gate-drain (Miller effect) capacitance, is reduced which significantly increases switching speeds.

Having thus described my invention, what is claimed is:

1. The method of making a field effect transistor comprising:
    forming on an insulating substrate at least one island comprising semi-conductor material of a first conductivity type, said island being in the form of a layer 0.8 to 1.2 micrometers in thickness;
    growing over the outer surface of said island a first, upper, thin masking layer 150 to 250 nanometers in thickness;
    removing two separated regions of said first upper layer, leaving an intermediate region of this layer as a mask;
    diffusing into the thus exposed separated regions of said wafer a material increasing the conductivity of the thus exposed separated regions, the increase being in the same polarity direction as the existing polarity of said semi-conductor material to thus create two separated enhanced discrete polarity regions comprising source and drain regions;
    removing the balance of said first insulating layer and growing a second insulating layer over the outer body of said wafer to a thickness of 800 to 1,000 nanometers, then etching a window in a small central portion, smaller than but within the area in which said intermediate region of said first layer was located, where a reduced thickness of 30 to 40 nanometers is grown to define a gate region;
    bombarding said gate region with an opposite, second, polarity type ion bombardment, the dosage of said bombardment being that required to exceed the original degree of impurity concentration in said wafer to a selected degree, whereby there is created a gate region of a second polarity separated from said source and drain regions by modified regions of said first polarity type, but of lesser conductivity than said source and drain regions;
    removing said second layer over said gate region of said wafer and cleaning the thus exposed surface of said wafer;
    growing a third insulating layer to a thickness of 100 to 110 nanometers over said gate region;
    removing said second layer over said source and drain regions, creating openings for source and drain contacts; and
    depositing conductive electrodes to thus exposed source and drain openings in said second layer and on said third layer over said gate region.

2. The method of making a field effect transistor as set forth in claim 1 wherein said semi-conductor material is silicon, and said layers comprise silicon dioxide.

3. The method as set forth in claim 2 wherein said gate region is of a P polarity, said modified regions are of an N polarity, and said source and drain regions are of an N+ polarity.

* * * * *